(12) United States Patent
Song et al.

(10) Patent No.: US 11,342,301 B2
(45) Date of Patent: May 24, 2022

(54) BONDING TOOLS FOR BONDING MACHINES, BONDING MACHINES FOR BONDING SEMICONDUCTOR ELEMENTS, AND RELATED METHODS

(71) Applicant: Kulicke and Soffa Industries, Inc., Fort Washington, PA (US)

(72) Inventors: Ai Jun Song, Jamison, PA (US); Jeremy Neyhart, Coopersburg, PA (US); Thomas Colosimo, West Chester, PA (US); Benjamin D. Trabin, Lansdale, PA (US); Matthew B. Wasserman, Philadelphia, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 17/324,977

(22) Filed: May 19, 2021

(65) Prior Publication Data

US 2021/0272926 A1  Sep. 2, 2021

Related U.S. Application Data

(62) Division of application No. 16/248,312, filed on Jan. 15, 2019, now Pat. No. 11,049,839.

(60) Provisional application No. 62/621,199, filed on Jan. 24, 2018.

(51) Int. Cl.
| | | |
|---|---|---|
| *H01L 23/00* | (2006.01) | |
| *B23K 1/00* | (2006.01) | |
| *B23K 3/08* | (2006.01) | |
| *B23K 1/008* | (2006.01) | |
| *B23K 101/40* | (2006.01) | |
| *B23K 101/42* | (2006.01) | |

(52) U.S. Cl.
CPC .............. *H01L 24/75* (2013.01); *B23K 1/008* (2013.01); *B23K 1/0016* (2013.01); *B23K 3/087* (2013.01); *H01L 24/81* (2013.01); *H01L 24/83* (2013.01); *B23K 2101/40* (2018.08); *B23K 2101/42* (2018.08); *H01L 2224/75756* (2013.01); *H01L 2224/81136* (2013.01); *H01L 2224/81203* (2013.01); *H01L 2224/81986* (2013.01); *H01L 2224/83136* (2013.01)

(58) Field of Classification Search
USPC .......................................................... 156/228
See application file for complete search history.

(56) References Cited

U.S. PATENT DOCUMENTS

| | | |
|---|---|---|
| 6,769,469 B2 | 8/2004 | Yamada |
| 7,395,847 B2 | 7/2008 | Teshirogi et al. |
| 2009/0154132 A1* | 6/2009 | Okamoto .............. H01L 25/105 156/228 |
| 2012/0319261 A1 | 12/2012 | Moody |

* cited by examiner

*Primary Examiner* — James D Sells
(74) *Attorney, Agent, or Firm* — Christopher M. Spletzer, Sr.

(57) ABSTRACT

A bonding tool for bonding a semiconductor element to a substrate on a bonding machine is provided. The bonding tool includes a body portion including a contact region for contacting the semiconductor element during a bonding process on the bonding machine. The bonding tool also includes a standoff extending from the body portion, and configured to contact the substrate during at least a portion of the bonding process.

20 Claims, 9 Drawing Sheets

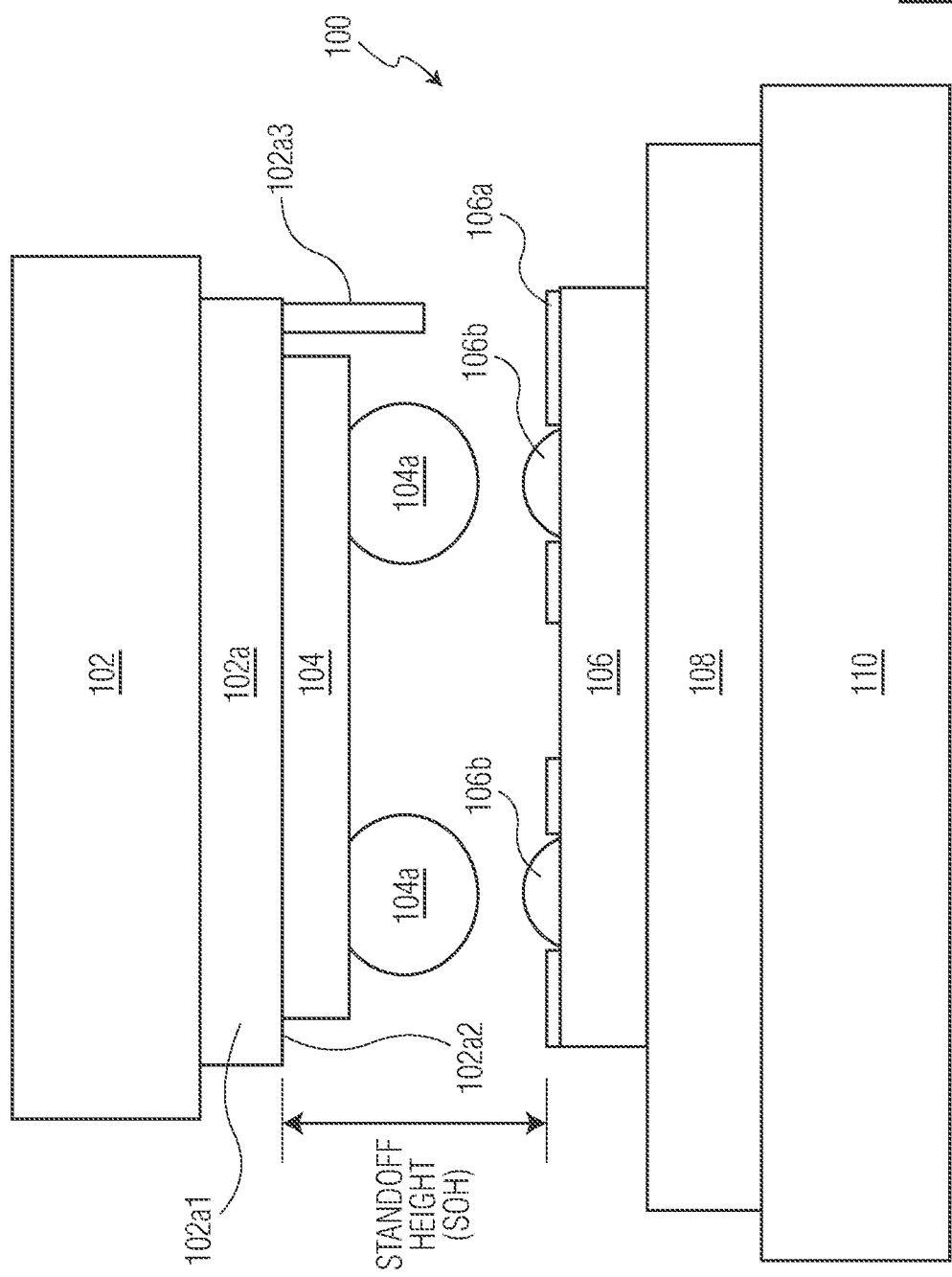

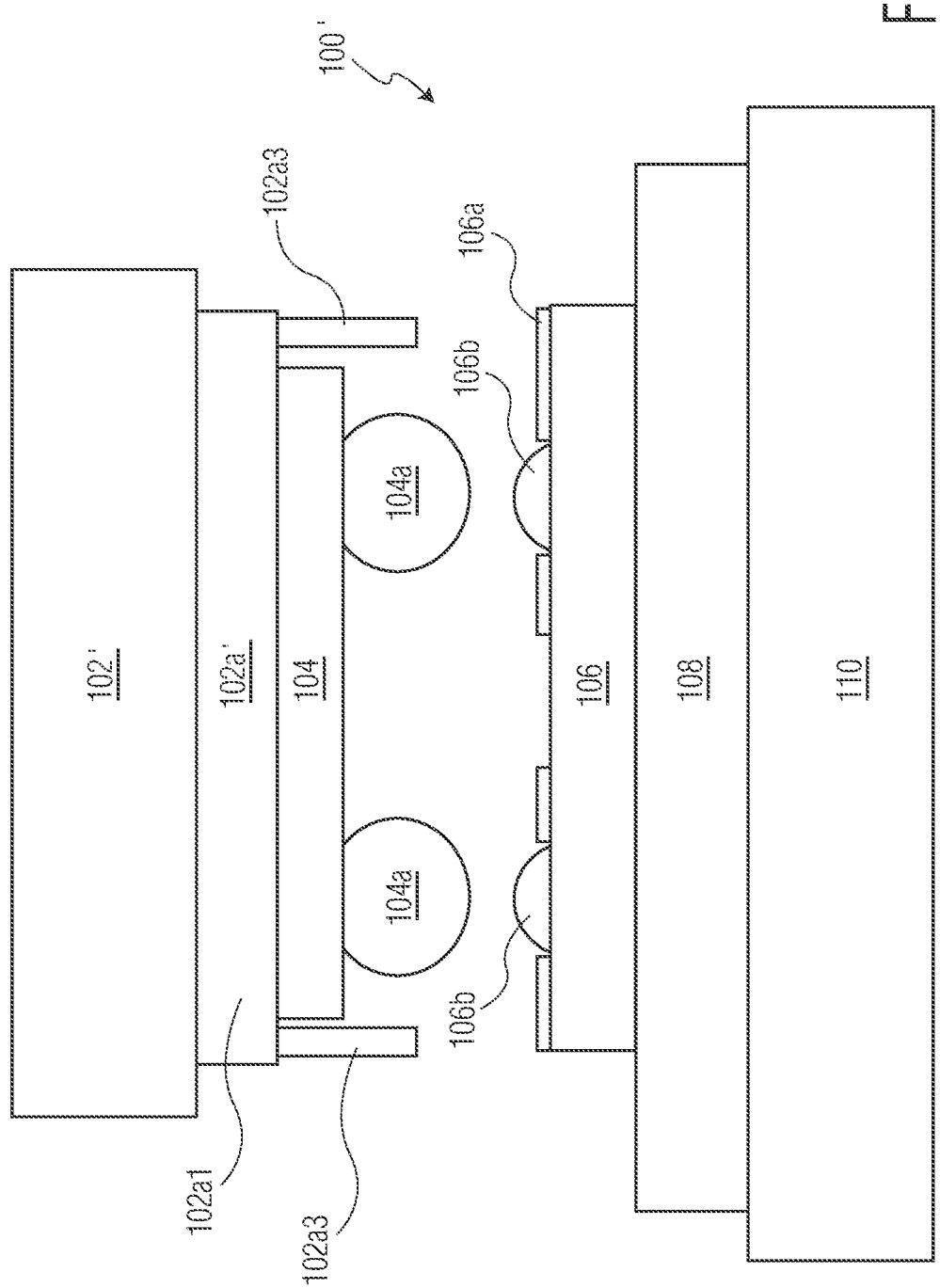

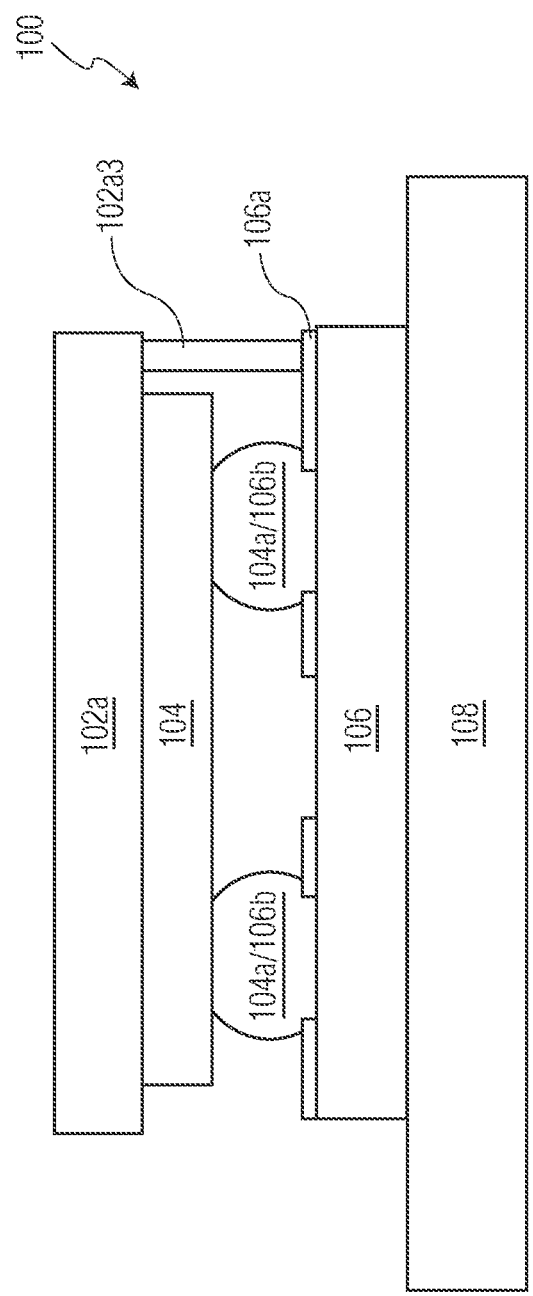

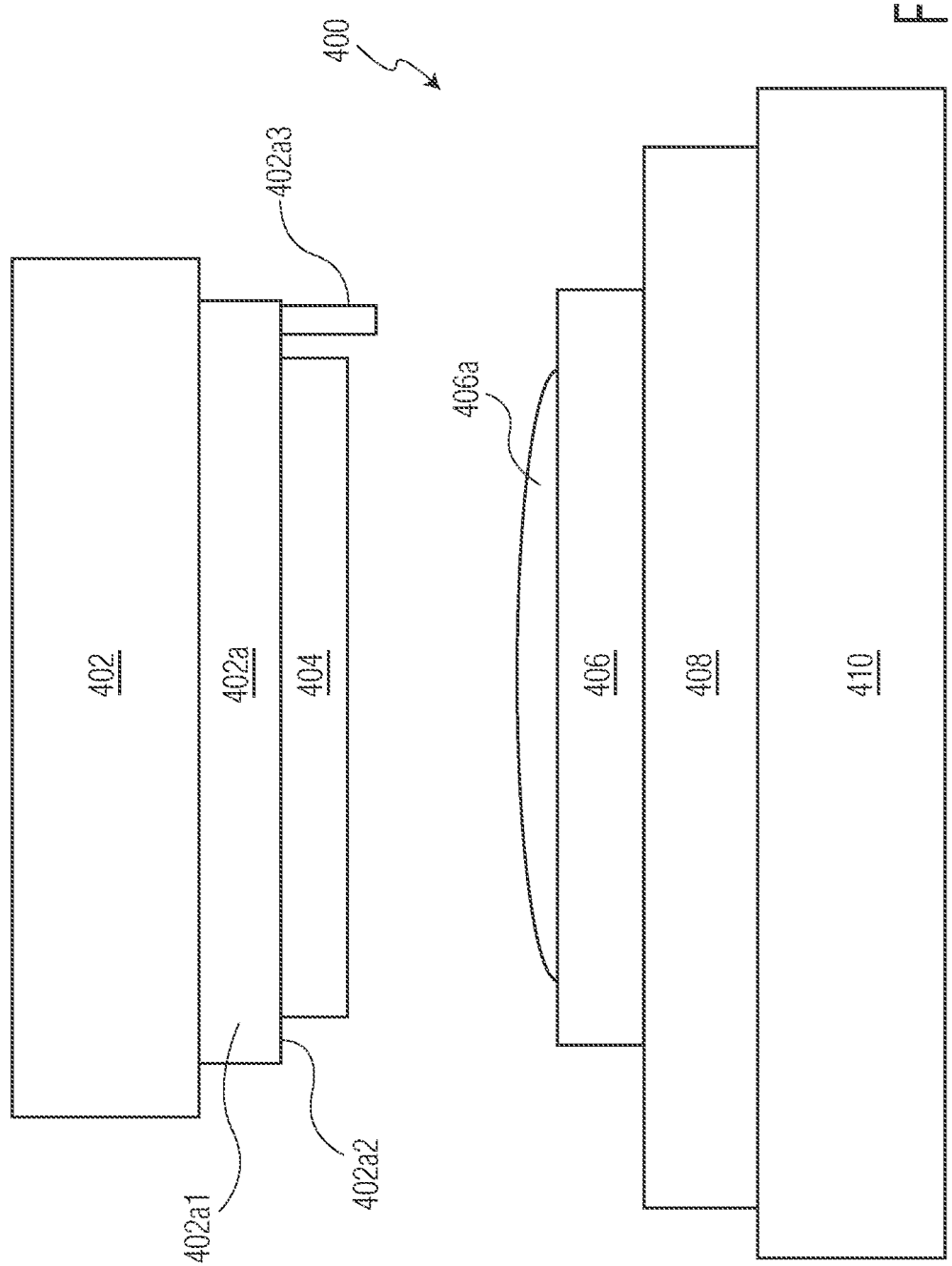

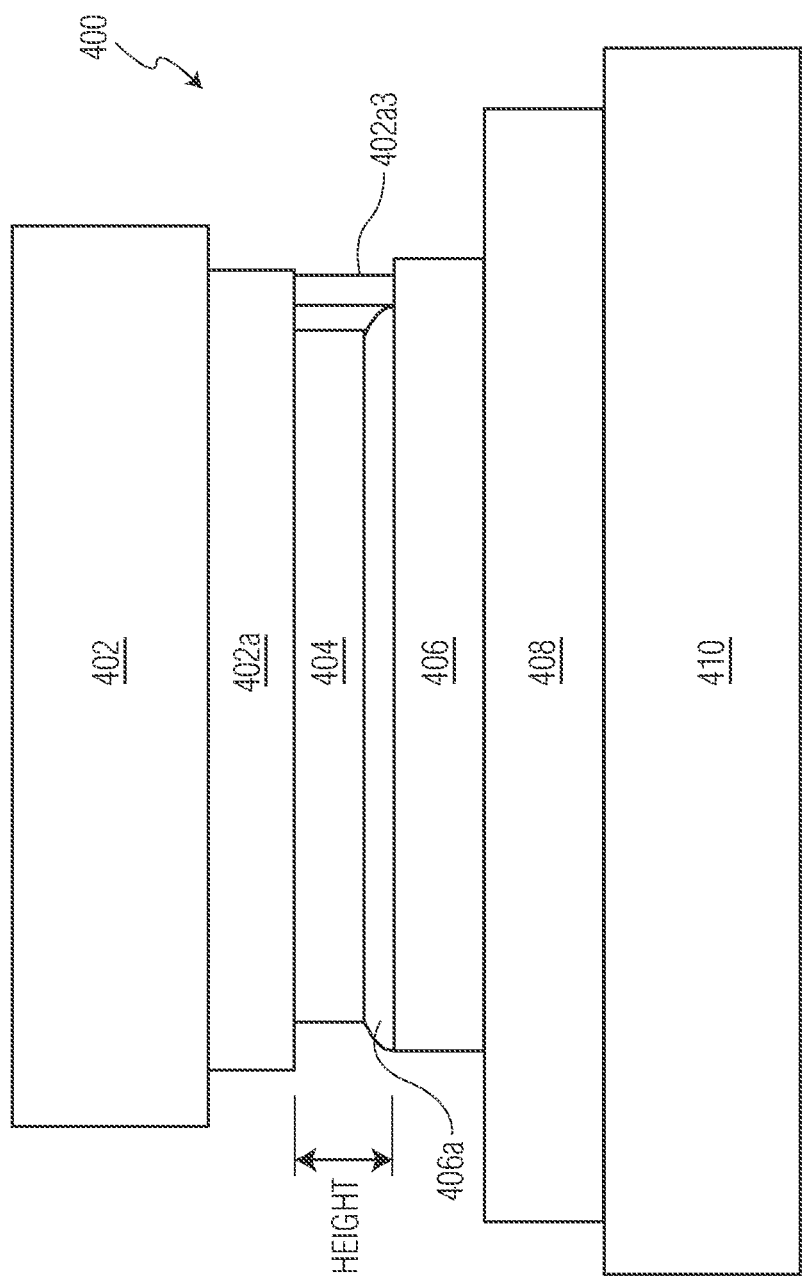

US 11,342,301 B2

BONDING TOOLS FOR BONDING MACHINES, BONDING MACHINES FOR BONDING SEMICONDUCTOR ELEMENTS, AND RELATED METHODS

CROSS-REFERENCE TO RELATED APPLICATION

This application is a divisional application of U.S. patent application Ser. No. 16/248,312 filed on Jan. 15, 2019, which claims the benefit of U.S. Provisional Application No. 62/621,199 filed on Jan. 24, 2018, the contents of both of which are incorporated herein by reference.

FIELD

The present invention relates to the formation of semiconductor packages, and more particularly, to improved bonding tools for use in connection with bonding machines for bonding semiconductor elements.

BACKGROUND

In certain aspects of the semiconductor packaging industry, semiconductor elements are bonded to bonding locations. For example, in conventional die attach (also known as die bonding) applications, a semiconductor die is bonded to a bonding location of a substrate (e.g., a leadframe, another die in stacked die applications, a spacer, etc.). In advanced packaging applications, semiconductor elements (e.g., bare semiconductor die, packaged semiconductor die, etc.) are bonded to bonding locations of a substrate (e.g., a leadframe, a PCB, a carrier, a semiconductor wafer, a BGA substrate, another semiconductor element, etc.), with conductive structures (e.g., conductive bumps, contact pads, solder bumps, conductive pillars, copper pillars, etc.) providing electrical interconnection between the semiconductor element and the substrate.

In certain applications of thermocompression bonding, a material (e.g., an underfill material) is applied in the area between the semiconductor element and the substrate after the thermocompression bonding operation is complete. Unfortunately, this area may vary (e.g., in terms of volume, for example, because of device variations (e.g., variations in the thickness of a solder mask layer on the substrate)).

Thus, it would be desirable to provide improved bonding tools, bonding machines including such bonding tools, and related methods.

SUMMARY

According to an exemplary embodiment of the invention, a bonding tool for bonding a semiconductor element to a substrate on a bonding machine is provided. The bonding tool includes a body portion including a contact region for contacting the semiconductor element during a bonding process on the bonding machine. The bonding tool also includes a standoff extending from the body portion, and configured to contact the substrate during at least a portion of the bonding process.

According to another exemplary embodiment of the invention, a bonding machine for bonding a semiconductor element to a substrate is provided. The bonding machine includes a bonding tool. The bonding tool includes (a) a body portion including a contact region for contacting the semiconductor element during a bonding process on the bonding machine, and (b) a standoff extending from the body portion, the standoff being configured to contact the substrate during at least a portion of a bonding operation. The bonding machine also includes a support structure for supporting the substrate.

According to yet another exemplary embodiment of the invention, a method of operating a bonding machine is provided. The method includes: (a) carrying a semiconductor element with a bonding tool; (b) initiating contact between conductive structures of the semiconductor element with corresponding conductive structures of a substrate; (c) lowering the bonding tool after step (b) such that a standoff of the bonding tool contacts an upper surface of the substrate; and (d) raising the bonding tool after step (c).

According to yet another exemplary embodiment of the invention, a method of operating a bonding machine is provided. The method includes: (a) carrying a semiconductor element with a bonding tool; (b) initiating contact between the semiconductor element and an adhesive material on a substrate; and (c) lowering the bonding tool after step (b) such that a standoff of the bonding tool contacts an upper surface of the substrate.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 1 is a block diagram side view of a bonding machine in accordance with an exemplary embodiment of the invention;

FIG. 2 is a block diagram side view of another bonding machine in accordance with an exemplary embodiment of the invention;

FIGS. 3A-3E are block diagram side views of elements of the bonding machine of FIG. 1 illustrating a method of operating the bonding machine in accordance with an exemplary embodiment of the invention; and FIGS. 4A-4B are block diagram side views of elements of a die attach machine illustrating a method of operating the bonding machine in accordance with an exemplary embodiment of the invention.

DETAILED DESCRIPTION

Figure 3A:
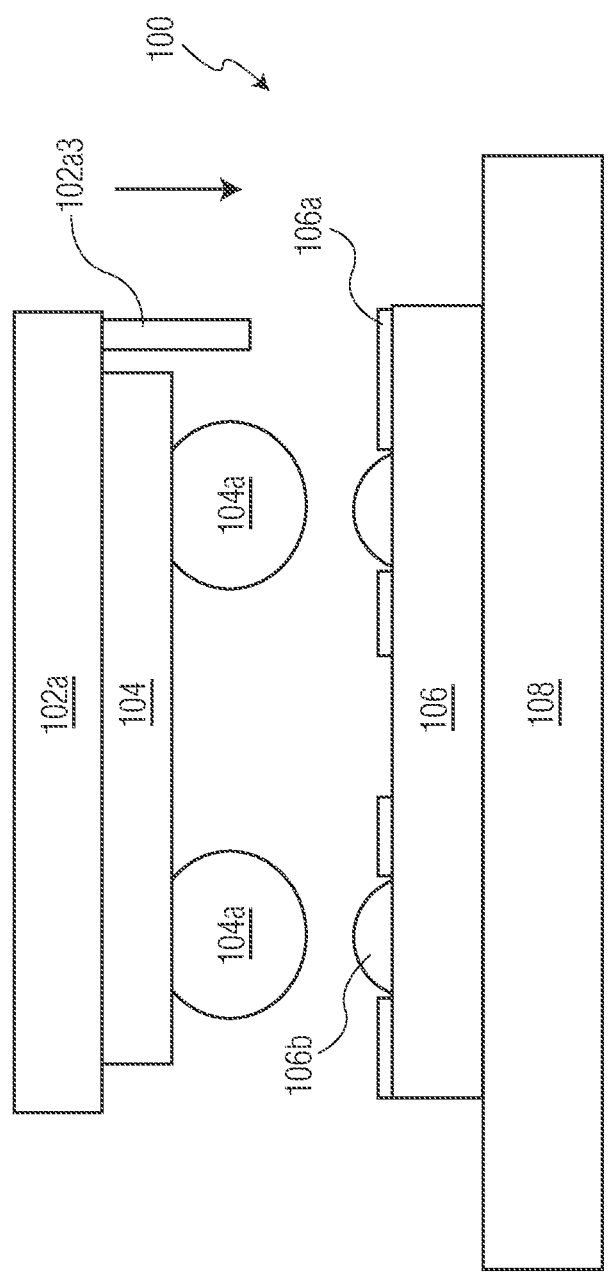

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the term "substrate" is intended to refer to any structure to which a semiconductor element may be bonded (e.g., thermocompressively bonded, ultrasonically bonded, thermosonically bonded, die bonded, etc.). Exemplary substrates include, for example, a leadframe, a PCB, a carrier, a semiconductor chip, a semiconductor wafer, a BGA substrate, a semiconductor element, etc. In accordance with certain exemplary aspects of the invention, a standoff (included in a bonding tool) may contact the substrate during at least a portion of a bonding process: it is understood that the standoff (or any extension of the standoff) may contact any part of the substrate (or any extension of the substrate).

In accordance with exemplary aspects of the invention, a bonding tool (e.g., a placer tool) is provided for a bonding machine, such as a thermocompression bonder (TCB) machine, a flip chip bonding machine, etc. For example, such a bonding tool may be attached to, or incorporated with, a heater (e.g., a pulse heater) for heating a semiconductor element in connection with a thermocompression bonding operation. In other embodiments of the invention, a bonding tool is provided for a die attach machine or other bonding machine.

In connection with a thermocompression bonding process, the bonding tool places a semiconductor element (e.g., a semiconductor die, an interposer, etc.) on, and bonds the semiconductor element to, a substrate (e.g., a semiconductor chip, a wafer, etc.). The substrate configured to receive the semiconductor element provides mechanical support for the semiconductor element, but may also provide electrical connection to the semiconductor element (through corresponding conductive structures on each of the substrate and the semiconductor element). For example, flip chip bonding of the semiconductor element to the substrate may include by in-situ melting and re-solidifying solder bumps on the semiconductor element being placed. In a specific example, the conductive structures on the substrate may be formed, for example, by etching copper sheets laminated onto a non-conductive material.

Often, the substrate includes a solder mask layer on top with openings to constraint the solder location during the solder joint formation. In practice, the solder mask layer thickness varies from location to location on the same substrate, and from batch to batch in different production lots. After thermocompression bonding of the semiconductor element(s) to the substrate, the now bonded substrate may go through a cleaning process and an encapsulation compound molding process.

In connection with the operation of certain bonding machines (e.g., flip chip bonding machines, TCB machines, etc.), a "standoff height" may be defined. For example, the standoff height (SOH) may refer to the distance between (a) the top surface of the semiconductor element being bonded and (b) the upper surface of the substrate (which may be the upper surface of the solder mask layer, in embodiments where the substrate includes a solder mask layer). FIG. 1 provides an exemplary illustration of a standoff height. The consistency of the standoff height (SOH) may significantly impact the molding consistency. Unfortunately, the standoff height may be difficult to maintain from device to device, at least in part, because of varying solder mask thickness on the substrate.

Aspects of the invention relate to bonding/placement tools (and related bonding machines), and methods of operating bonding machines, to compensate for issues such as solder mask variation, thereby providing a more consistent standoff height. In specific examples of the invention, the bonding/placement tools include one or more standoffs (e.g., extending from the contact surface of the tool) which may be used to detect the solder mask layer during thermocompression bonding. Using such an approach, the final distance from the semiconductor element to the upper surface of the substrate (e.g., the standoff height) may be made more consistent.

The "standoff" provided on the bonding/placement tool may be, for example, a post, a plurality of posts, a wall, a plurality of walls, among other structures.

The bonding tool may be a heated tool where the heater and the tool are integrated into one component. In other examples, a heater separate from the bonding tool may be provided. In yet other examples, non-heated bonding tools may be utilized. Bonding tools according to the invention may define one or more vacuum paths that provide vacuum used to hold the semiconductor elements.

Bonding tools according to the invention may be used in connection with a bonding machine (e.g., a thermocompression bonding machine (TCB machine), a flip chip bonding machine, a conventional die attach machine, etc.). In connection with a thermocompression bonding machine, the bonding tool may refer to a part that can be attached onto, or integrated with, the pulse heater (in an embodiment where the heater is separate from the tool). The bonding tool may sometimes be referred to as a collet, a die collet, a placer tool, a placement tool, among other names, depending on the application.

In a TCB process, the bonding tool typically places and bonds a semiconductor element (e.g., a die or interposer) to a substrate (e.g., any type of substrate such as a chip, a wafer, etc.) by in-situ melting and re-solidifying solder bumps on the semiconductor element being placed. Heat is typically applied from the semiconductor element side only, while the substrate is typically maintained at a low stage temperature, as opposed to isothermal heating in mass reflow.

Throughout the various drawings, like reference numerals refer to the like elements.

Referring now to the drawings, FIG. 1 illustrates bonding machine 100 (e.g., a thermocompression bonding machine, a flip chip bonding machine, etc.). Bonding machine 100 includes bond head assembly 102 carrying a bonding tool 102a. Bonding tool 102a may be formed, for example, using a high heat conductivity material such as an aluminum nitride ceramic material. Of course, other materials are contemplated for bonding tool 102a (and other tools within the scope of the invention). Bonding tool 102a includes a body portion 102a1 carrying (e.g., using vacuum, etc.) semiconductor element 104. Bonding tool 102a includes a contact surface 102a2 for contacting semiconductor element 104 during a bonding process. Bonding tool 102a also includes standoff 102a3 (e.g., a post or the like). Semiconductor element 104 includes conductive structures 104a (e.g., Sn contacts configured for solder interconnection).

Bonding machine 100 also includes a support structure 108 (e.g., a chuck or the like) (where support structure 108 is carried by machine base 110). Substrate 106 is supported by support structure 108, and includes conductive structures 106b configured for connection (e.g., solder interconnection) to respective conductive structures 104a. Solder mask layer 106a is provided on an upper surface of substrate 106. The standoff height (SOH) is shown as the distance/height between an upper surface of semiconductor element 104 and the upper surface of solder mask layer 106a (of course, in FIG. 1 the SOH is shown with semiconductor element 104 above, and not bonded to, substrate 106—and the SOH may also measured in the bonded position as shown in FIG. 3E).

FIG. 2 illustrates a bonding machine 100' that is very similar to bonding machine 100 from FIG. 1. As between FIG. 1 and FIG. 2, like reference numbers refer to the same (or similar) elements. As compared to bonding tool 102a (shown in FIG. 1, which includes a single standoff 102a3), bonding tool 102a' (included in bonding head assembly 102' of bonding machine 100' in FIG. 2) includes a plurality of standoffs 102a3 (in the example shown in FIG. 2, two standoffs 102a3 are provided). Any number of standoffs may be provided, as desired in the given application. Further, the standoffs may have any desired configuration such as a post, a wall, etc. Such variations (e.g., the number of standoffs, the types of standoffs such as post or wall, etc.) may be applicable to any application of the invention including but not limited to flip chip bonding, thermocompression bonding, and die attach processes.

Figure 3B:
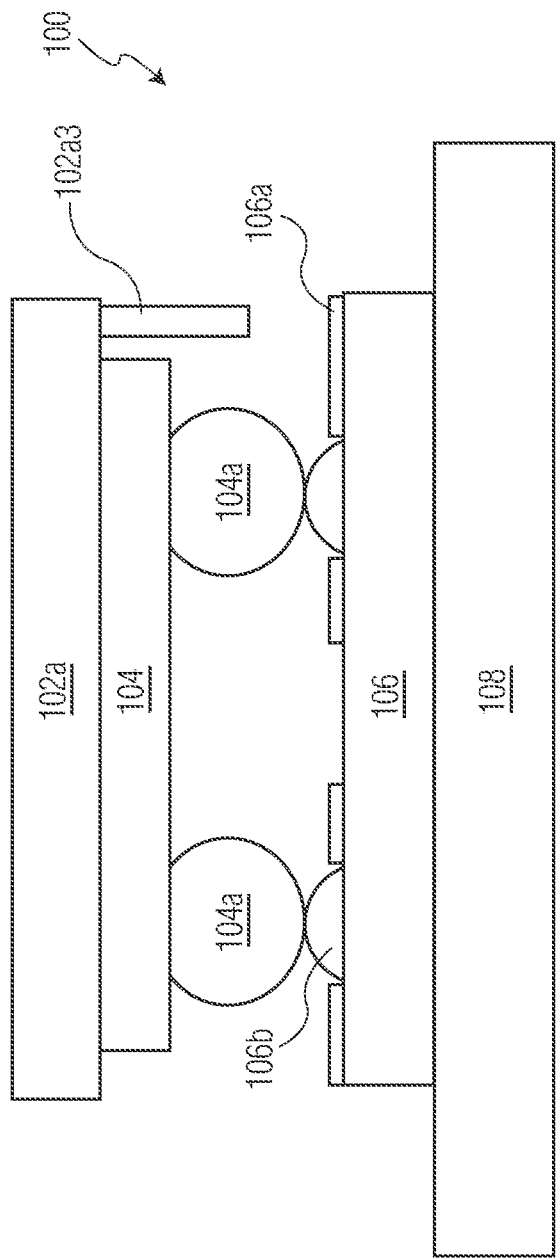
Figure 3C:
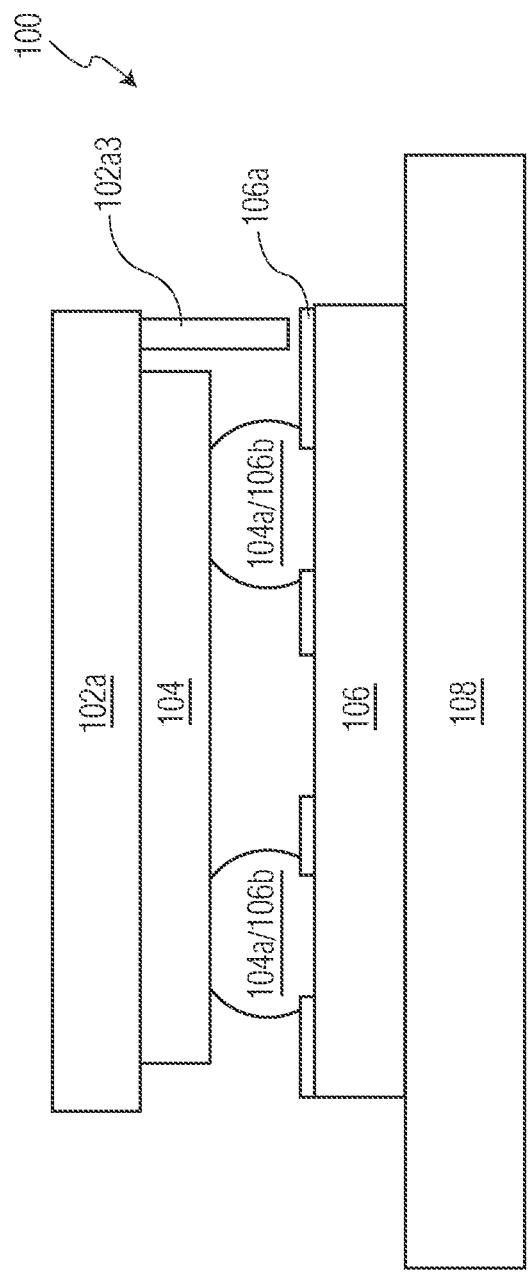
Figure 3E:
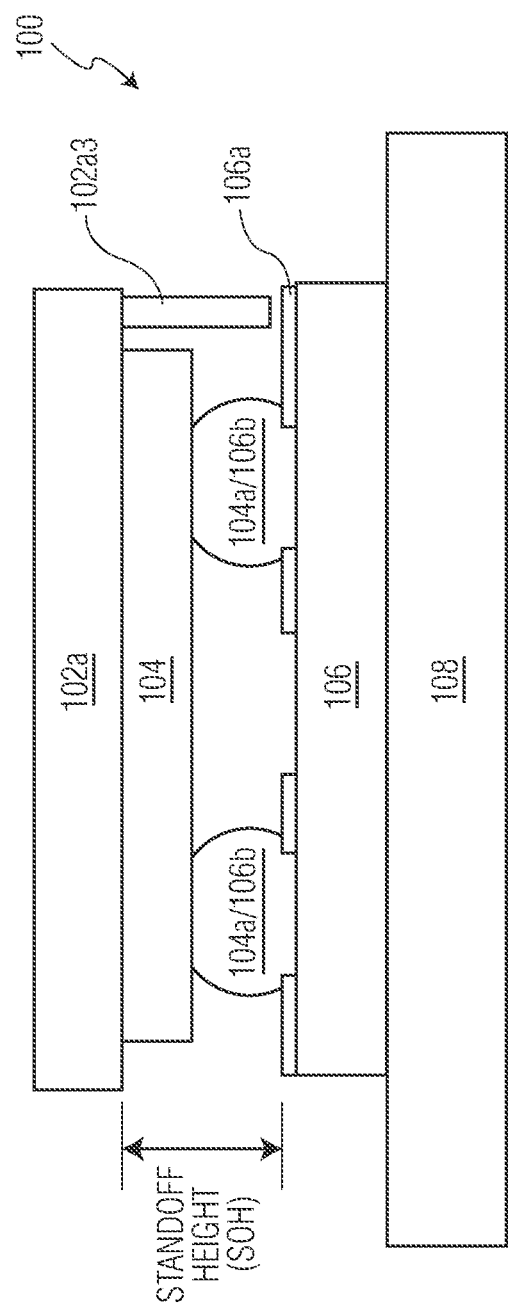

FIGS. 3A-3E illustrate a bonding operation of bonding machine 100 of FIG. 1 (with certain elements removed for simplicity), with a single standoff 102a3, but is also applicable to embodiments with multiple standoffs 102a3 (such as shown in FIG. 2). At FIG. 3A, bonding tool 102 is moving toward, and approaching substrate 106 (as illustrated by the downward arrow). FIG. 3B illustrates initial contact between (i) conductive structures 104a of semiconductor element 104 and (ii) corresponding conductive structures 106b of substrate 106. This initial contact may be detected (and/or declared) using any of a number of methods such as bond force detection (e.g., a change in bond force), position detection (e.g., using a z-axis position measurement/detection system), velocity detection, among other techniques. FIG. 3C illustrates solder melting, etc. such that pairs of conductive structures 104a/106b have begun to change form. At FIG. 3D, standoff 102a3 has made contact with solder mask layer 106a of substrate 106. This contact may be detected (and/or declared) using any of a number of methods such as bond force detection (e.g., a change in bond force), position detection (e.g., using a z-axis position measurement/detection system), velocity detection, among other techniques. After this contact is detected, bonding tool 102a may be raised a predetermined distance (such that a "final" SOH is established, see FIG. 3E), and then the pairs of modified (e.g., melted) conductive structures 104a/106b will solidify in this position. Following FIG. 3E, underfill material may be added in the gap between semiconductor element 104 and substrate 106, followed by encapsulation.

Aspects of the invention are also applicable to die attach tools, die attach equipment, and die attach processes. In such applications, it may be desirable to have relative consistency regarding the thickness of an adhesive (such as an epoxy layer) between the die backside and the substrate. This thickness is sometimes referred to as the "bond line thickness" (i.e., the BLT).

FIG. 4A illustrates bonding machine 400 (e.g., a die attach machine, etc.). Bonding machine 400 includes bond head assembly 402 carrying a bonding tool 402a (e.g., die attach tool 402a). Bonding tool 402a includes a body portion 402a1 carrying (e.g., using vacuum, etc.) semiconductor element 404 (e.g., semiconductor die 404). Bonding tool 402a includes a contact surface 402a2 for contacting semiconductor element 404 during a die attach process. Bonding tool 402a also includes standoff 402a3 (e.g., a post or the like) for controlling the z-height/descent during the die attach process. Multiple standoffs may be included (e.g., see FIG. 2).

Bonding machine 400 also includes a support structure 408 (e.g., a chuck or the like) (where support structure 408 is carried by machine base 410). Substrate 406 is supported by support structure 408, and includes adhesive (e.g., a conventional die attach adhesive such as an epoxy adhesive).

FIG. 4B illustrates bond head assembly 402 having descended such that bonding tool 402a attaches semiconductor element 404 to substrate 406, with adhesive 406a disposed therebetween. As shown in FIG. 4B, adhesive 406a has spread out through the die attach process. Standoff 402a3 controls the height to which bond head assembly 402 (including bonding tool 402a) descends during the die attach process, thereby controlling the amount of squash of adhesive 406a, and hence controlling the bond line thickness (BLT).

Although the invention has been illustrated and described in connection with specific example structures and methods, it is not limited thereto. For example, aspects of the invention may relate to one or more standoffs, having any desired shape and/or configuration. Further, such standoffs may be used to define the SOH (or BLT or other criteria) while upon contact with the substrate—or such standoffs may be used to define the SOH (or BLT or other criteria) by moving a predetermined distance away after contact with the substrate (e.g., see FIG. 3E).

Further still, the machines may vary considerably from the simplified drawings provided herein. For example, bonding tools within the scope of the invention may also be a pick tool (where the bonding tool "picks" a semiconductor element from a supply, such as a wafer, and the places the semiconductor element on the substrate). In other examples, the bonding tool may receive the semiconductor element through some type of transfer operation (e.g., where the transfer is made from a separate pick tool, or a separate transfer tool, etc.).

Although the invention is illustrated and described primarily by reference to embodiments including one or more structural standoffs, the invention is not limited thereto. Different and/or additional technologies (non-contact technologies) may be utilized to accurately control the heights during the bonding processes. For example, a laser system may be utilized to detect a bonding surface and/or bonding tool, to control the final height (e.g., the SOH in FIG. 3E, the BLT height in FIG. 4B, etc.). Other example technologies include hall effect sensors, proximity sensors, position sensors, motion sensors, velocity sensors, capacitive sensors, among others.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of operating a bonding machine, the method comprising the steps of:
   (a) carrying a semiconductor element with a bonding tool, the semiconductor element being provided from a supply on the bonding machine, the bonding tool being configured to carry the semiconductor element to a substrate prior to a bonding process, the bonding tool including a body portion defining a vacuum path for providing a vacuum, the bonding tool being configured to carry the semiconductor element using the vacuum;
   (b) initiating contact between conductive structures of the semiconductor element with corresponding conductive structures of the substrate;
   (c) lowering the bonding tool after step (b) such that a standoff of the bonding tool contacts an upper surface of the substrate; and
   (d) raising the bonding tool after step (c).

2. The method of claim 1 wherein step (c) includes contacting a solder mask layer of the substrate with the standoff.

3. The method of claim 1 wherein step (d) includes raising the bonding tool after step (c) by a predetermined amount.

4. The method of claim 1 further comprising the step of at least partially melting at least one of (i) conductive structures of the semiconductor element and (ii) corresponding conductive structures of substrate between steps (b) and (c).

5. The method of claim 4 further comprising the step of solidifying the conductive structures of the semiconductor element and the corresponding conductive structures of a substrate after step (d).

6. A method of operating a die attach machine, the method comprising the steps of:
   (a) carrying a semiconductor element with a bonding tool, the semiconductor element being provided from a supply on the die attach machine, the bonding tool being configured to carry the semiconductor element to a substrate prior to a bonding process, the bonding tool including a body portion defining a vacuum path for providing a vacuum, the bonding tool being configured to carry the semiconductor element using the vacuum;
   (b) initiating contact between the semiconductor element and an adhesive material on the substrate; and
   (c) lowering the bonding tool after step (b) such that a standoff of the bonding tool contacts an upper surface of the substrate.

7. The method of claim 1 wherein the bonding tool includes a plurality of the standoffs extending from the body portion and configured to contact the substrate during at least a portion of the bonding process.

8. The method of claim 1 wherein the standoff extends from a contact region of the body portion.

9. The method of claim 1 wherein the standoff is coupled to the body portion.

10. The method of claim 1 wherein the standoff is formed from a unitary piece of material including the body portion.

11. The method of claim 1 wherein the bonding process is a thermocompression bonding process.

12. The method of claim 1 wherein the standoff is configured to contact a solder mask portion of the substrate during at least a portion of the bonding process.

13. The method of claim 1 wherein the standoff is a post.

14. The method of claim 1 wherein the standoff is a wall.

15. The method of claim 1 wherein the semiconductor element is an interposer.

16. The method of claim 6 wherein the bonding tool is a die attach tool, and wherein the bonding process is a die attach process.

17. The method of claim 16 wherein the standoff is configured to control a thickness of an adhesive between the semiconductor element and the substrate during the die attach process.

18. The method of claim 6 wherein the bonding tool includes a plurality of the standoffs extending from the body portion and configured to contact the substrate during at least a portion of the bonding process.

19. The method of claim 6 wherein the standoff is a post.

20. The method of claim 6 wherein the standoff is a wall.

* * * * *